United States Patent [19]

Reimer et al.

[11] Patent Number: 4,745,360
[45] Date of Patent: May 17, 1988

[54] ELECTRON-BEAM PROBE SYSTEM UTILIZING TEST DEVICE HAVING INTERDIGITATED CONDUCTIVE PATTERN AND ASSOCIATED METHOD OF USING THE TEST DEVICE

[75] Inventors: Jan D. Reimer, Palo Alto; Victor R. Akylas, San Jose, both of Calif.

[73] Assignee: North American Phillips Corporation, Signetics Division, Sunnyvale, Calif.

[21] Appl. No.: 858,613

[22] Filed: May 1, 1986

[51] Int. Cl.$^4$ .................. G01R 19/00; G01R 35/00
[52] U.S. Cl. ........................ 324/158 R; 250/310; 250/492.2
[58] Field of Search ............ 324/158 R, 71.3; 250/310, 311, 396 R; 357/68; 358/213.23

[56] References Cited

U.S. PATENT DOCUMENTS 3,652,907  3/1972  Page et al. .................. 357/68 X
4,528,596  7/1985  Cope .......................... 358/213.23 X

OTHER PUBLICATIONS

Scanning Electron Microscopy, 1976 (Part IV), Catalano, J., "SEM on Charge Injection Semiconductor Devices", Proc. of the Workshop on Microelectronic Device Fabrication and Quality Control with the SEM, Toronto Canada (5-9 April, 1976) pp. 521-528.
Feuerbaun, "VLSI Testing Using the Electron Probe, "Scanning Electron Microscopy (SEM), 1979, pp. 285-296 and 318.
Feuerbaun et al., "Improved Secondary Electron Signal Processing for Waveform Measurements," SEM, 1982, pp. 1501-1505.
Menzel et al., "Secondary Electron Analyzers for Voltage Measurements," SEM, 1983, pp. 65-75.
Feuerbaum, "Electron Beam Testing: Methods and Applications," Scanning, Vol. 5, No. 1, 1983, pp. 14-24.
Nakamura et al., "An Analysis of the Local Field Effect on Electron Probe Voltage Measurements," SEM, 1983, pp. 1187-1195.
Fujioka et al., "Voltage Measurements on Passivated Electrodes with the Scanning Electron Microscope," SEM, 1983, pp. 1157-1162.

*Primary Examiner*—Reinhard J. Eisenzopf
*Assistant Examiner*—Stephen M. Baker
*Attorney, Agent, or Firm*—R. Meetin; J. Oisher; T. Briody

[57] ABSTRACT

A test device (40) has a patterned conductive layer (42 or 44) particularly adapted for use in an E-beam probe system (FIG. 3) to study how local electric fields influence probe voltage measurements. The layer is composed of two or more conductors (A and $B_J$ C and $D_J$) separated from each other. Each conductor has a group of fingers. The fingers ($F1_p$, $F0_p$, F2, $F0_Q$ and $F1_Q$) run parallel to one another and are at least partially interdigitated. The width of each finger is constant along its length. The widths of the fingers and the spacings between them vary from finger to finger according to a selected pattern.

20 Claims, 4 Drawing Sheets

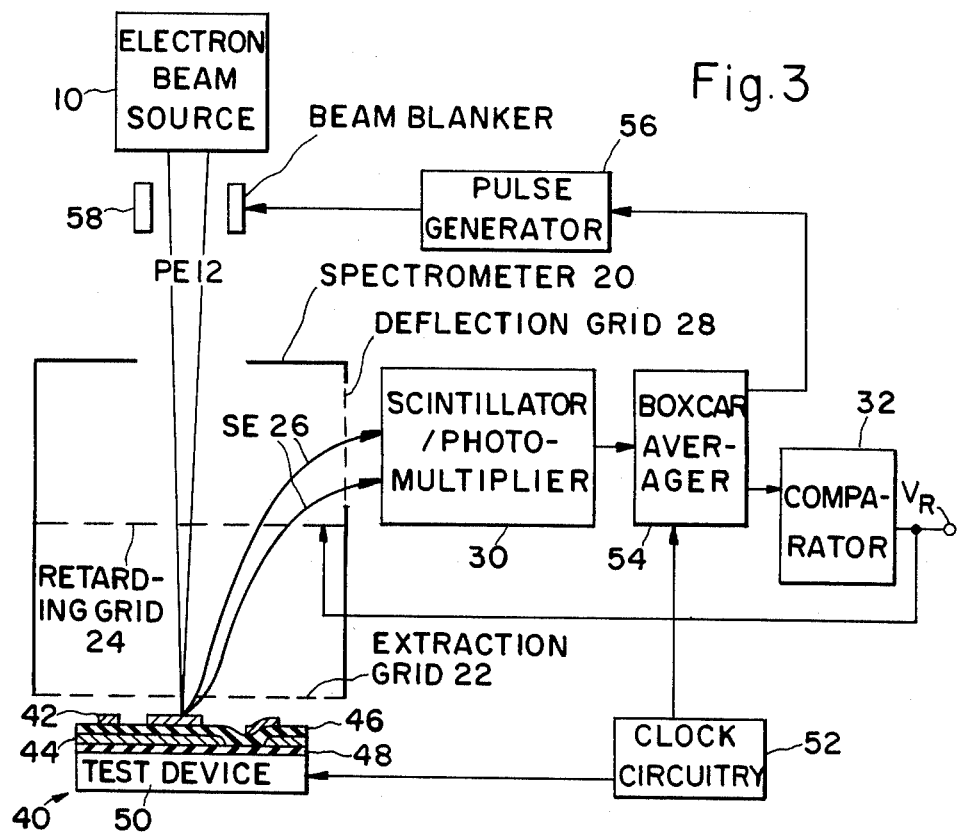
Fig. 3
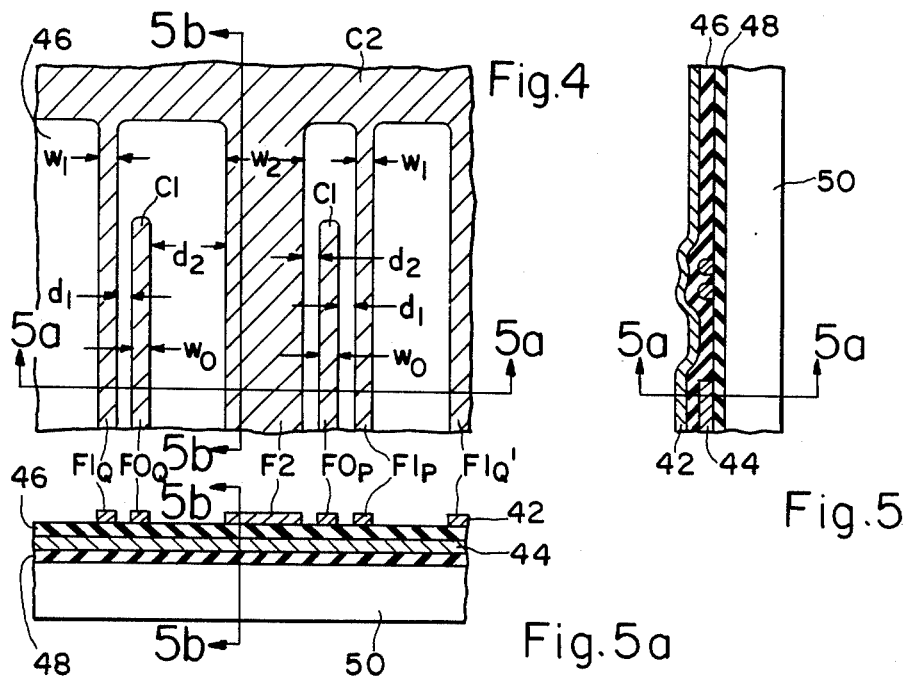
Fig. 4
Fig. 5a
Fig. 5b

ELECTRON-BEAM PROBE SYSTEM UTILIZING TEST DEVICE HAVING INTERDIGITATED CONDUCTIVE PATTERN AND ASSOCIATED METHOD OF USING THE TEST DEVICE

FIELD OF USE

This invention relates to electron-beam (E-beam) probe systems for making voltage measurements on devices such as an integrated circuit (IC).

BACKGROUND ART

The mechanical probe is the principal instrument used in the past for making voltage measurements at the internal nodes of an IC. As IC density has increased, it has become increasingly difficult to employ the mechanical probe. The conductive lines in many current IC's are so fine that they are easily damaged by the mechanical probe. The instrument is often too large to contact a single line but avoid its neighbors. Also, today's measurements must be more accurate than in the past. The capacitive loading present when the mechanical probe contacts a conductive line can give a misleading result.

The E-beam probe generally overcomes these disadvantages. FIG. 1 illustrates the basic features of an E-beam probe system of the planar retarding field analyzer type. The operation of this system is described in: Feuerbaum, "VLSI Testing Using the Electron Probe," *Scanning Electron Microscopy* (SEM), 1979, pp. 285–296 and 318; Feuerbaum et al., "Improved Secondary Electron Signal Processing for Waveform Measurements, " *SEM*, 1982, pp. 1501–1505; Menzel et al., "Secondary Electron Analyzers for Voltage Measurements," *SEM*, 1983, pp. 65–75; and Feuerbaum, "Electron Beam Testing: Methods and Apllication," *Scanning*, Vol. 5, No. 1, 1983, pp. 14–24.

In brief, an E-beam source 10 directs a beam of primary electrons (PE) 12 toward a patterned electrically conductive layer 14 lying on an electrically insulating layer 16 of a device 18 such as an IC. As PE 12 impact the specific conductive portion being examined, they cause it to emit secondary electrons (SE). The energy of the SE depends on the voltage $V_A$ applied to the portion under examination.

The SE are analyzed with a spectrometer 20 which contains an extraction grid 22 maintained at a high voltage for accelerating the emitted SE, enabline them to overcome retarding fields near the upper surface of device 18. A retarding grid 24 decelerates the emitted SE and allows the SE 26 having a certain minimum energy to pass. A deflection grid 28 diverts SE 26 out of spectrometer 20 toward a detector 30. It collects SE 26 and generates an electrical signal representative of their energy.

Measurements are more accurate if the shape of the curve representing the number of emitted SE as a function of electron energy remains constant as voltage $V_A$ changes. This is achieved by arranging a feedback loop so that substantially the same number of SE 26 are collected regardless of the value of $V_A$. In the feedback loop, a comparator 32 provides grid 24 with a voltage $V_R$ at a value sufficient to maintain the collected SE current substantially constant. Voltage $V_R$ is the output signal of the E-beam system. In the absence of measurement error, $V_R$ tracks $V_A$ and is typically linearized one-to-one so as to (ideally) equal $V_A$.

Local electric fields resulting from neighboring portions of device 18 at voltages different than $V_A$ produce measurement errors. Microfields influence the trajectories of the emitted SE and consequently the detected SE current. If any of the microfields are of the retarding type, they also hinder low-energy SE from passing grid 24. Raising the voltage on grid 22 to increase the extraction field strength can improve the efficiency of SE collection under certain conditions. However, this is merely an avoidance technique. For many applications, it is desirable to understand quantitatively how local fields affect voltage VR so as to correct its value appropriately.

Nakamura et al. studied the quantitative influence of local fields in "An Analysis of the Local Field Effect on Electron Probe Voltage Measurements," *SEM*, 1983, pp. 1187–1195. FIG. 2 illustrates the basic features of their semiconductor test device. Layer 14 consisted of three sets 34, 36, and 38 of conductive lines. Each set consisted of a sample conductor LS flanked symmetrically by a pair of identical neighbors $L_N$. The widths $w_S$ and $w_N$ of conductors $L_S$ and $L_N$ and the distance $d_N$ from conductor $L_S$ to either neighbor $L_N$ all varied from 10 to 50 micrometers. The PE beam energy was 25 kiloelectron volts (keV). As is evident from FIG. 2, Nakamura et al. determined how one of $w_s$, $w_n$, and $d_n$ affected voltage $V_R$ while the other two were held constant.

Nakamura et al. do provide a step forward in determining the quantitative effect of local fields. However, conductor widths and spacings of current IC interest are under 10 micrometers, typically 1–5 micrometers. This is about an order of magnitude less than the dimensions studied by Nakamura et al. Their 25-keV beam energy would cause significant damage to many present IC's. To avoid damage, the beam energy should be at least an order of magnitude lower. Attempting to scale their designs down to state-of-the-art dimensions and beam energies would be difficult, at best.

Furthermore, Nakamura et al. used an electrode arrangement in which the dimensions varied along the conductor lengths. Reproducing such a tapered geometry at current IC dimensions would be highly impractical. Significant measurement error would appear to exist in simply ascertaining the locations along the conductors where the measurements are taken. The work of Nakamura et al. is of academic interest but little practical utility to present/future IC technology.

GENERAL DISCLOSURE OF THE INVENTION

The present invention centers around a test device having an interdigitated electrically conductive pattern suitable for studying how measurements made with an E-beam probe are affected by local electric fields and certain other parameters. The pattern dimensions and beam energy can be chosen to be compatible with state-of-the-art IC technology. Using the instant test device, measured voltage can be compared with applied voltage to develop error correction factors as a function of conductor width, distance to neighbors, width of neighbors, voltage of neighbors, and number of neighbors. The test device can be used to improve both the operating conditions and internal components of the E-beam probe. The invention thus provides a large gain over the prior art.

In one aspect, the invention is a system containing three basic components: a test device having a patterned conductive layer, a mechanism for directing a beam of PE towards the layer to cause the device to emit SE, and a mechanism for collecting SE emitted from the device. The layer is composed of at least one region. Each region has first and second conductors separated from each other. Each conductor has a group of fingers. The fingers of the two conductors run substantially parallel to one another and are at least partially interdigitated. The width of each finger is largely constant along its length.

Each region is preferably composed of a plurality of subregions. Each subregion has a specified finger of the first conductor lying between a pair of neighboring fingers. The width of the specified finger in each subregion differs from the width of the specified finger in each other subregion of the same region. If there are two or more regions, the subregions fall into sets of corresponding subregions where each subregion in each such set comes from a different region. The widths of the specified fingers are then largely the same in each set of corresponding subregions.

The widths of the neighbors and their spacings from the specified finger in each subregion can be varied in the same general type of way to investigate how the various width/spacing parameters influence local fields. The width/spacing dimensions are typically less than 10 micrometers. Using a beam energy no greater than 2.5 keV, typically 1 keV, the present system is particularly applicable to state-of-the-art IC's.

In another aspect, the invention is a method in which a beam of PE is directed towards a patterned conductive layer of a test device to cause it to emit SE, certain of the SE are collected, and a signal representative of the energy of the collected SE is generated. The layer has the characteristics described above.

In yet another aspect, the invention is a test device containing a patterned conductive layer composed of a plurality of regions. The layer has the specific properties given above for the regions, subregions, and manner in which the widths of the specified fingers vary across the subregions. In addition, the spacing from the specified finger to one of its neighbors is largely the same for all the subregions in each region but differs from region to region.

BRIEF DESCRIPTION OF THE DRAWINGS

FIG. 3 is a block diagram of the components of an E-beam probe system using a semiconductor test device in accordance with the invention.

FIG. 4 is a top view of a portion of a semiconductor test device according to the invention.

FIGS. 5a and 5b are cross-sectional side views of the device of FIG. 4 taken respectively through planes 5a–5a and 5b–5b.

Like reference symbols are used in the drawings and in the description of the preferred embodiment to represent the same or very similar item or items.

DESCRIPTION OF THE PREFERRED EMBODIMENT

Figure 1:
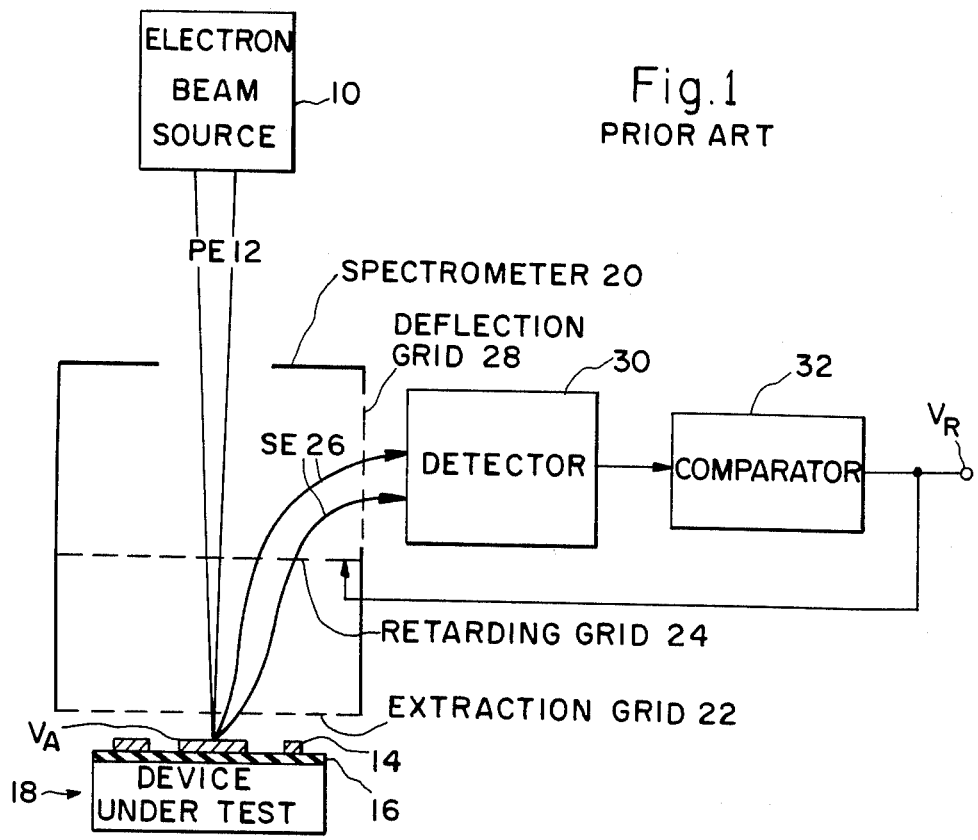
FIG. 1 is a block diagram of the basic components of a conventional E-beam probe system.
Figure 2:
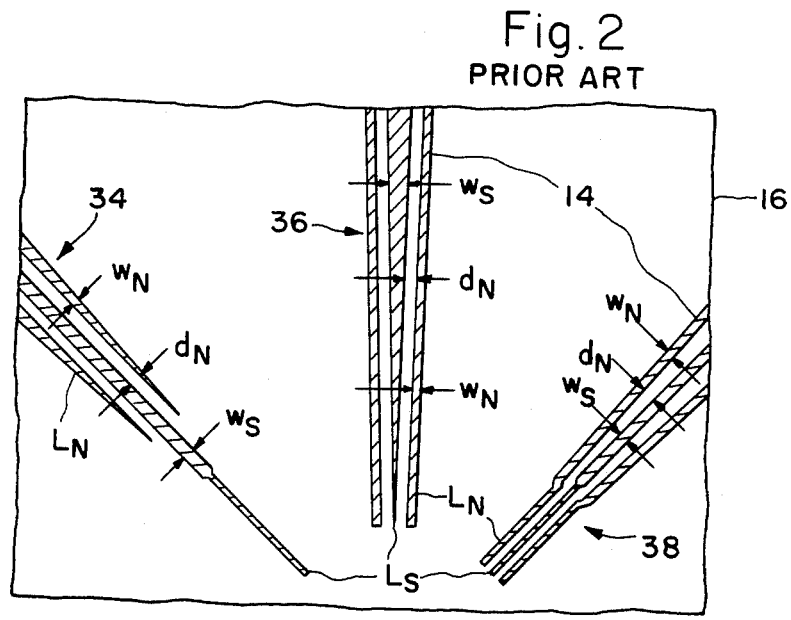
FIG. 2 is a top view of a portion of a prior art semiconductor test device used in an E-beam probe system.

FIG. 3 illustrates an E-beam probe system employing a semiconductor test device 40 having patterned metal layers 42 and 44 suitable for investigating the effects of local electric fields on the measurements of voltage $V_A$ applied to a specific portion of layer 42 or 44 under examination. Each of conductive layers 42 and 44 consists of about 1.0 micrometer of aluminum with about 1% silicon. Upper layer 42 lies on an insulating layer 46 overlying lower layer 44. In turn, layer 44 lies on an insulating layer 48 along the top of a monocrystalline silicon semiconductor substrate 50.

The probe system here is an ICT 8410 planar field retarding analyzer machine. A computer (not shown) controls data acquisition and display. The system is fitted with an AMRAY 1610 scanning electron microscope (not shown) for locating the desired portion of layer 42 or 44 to be examined.

The probe system contains components 10, 20, and 30, all arranged in the manner described for FIG. 1. Source 10 directs PE 12 toward the portion of layer 42 or 44 being examined, causing device 40 to emit SE from a depth of approximately 10 nanometers. SE are directly emitted from the portion being investigated if it is a part of layer 42. If the portion under examination is a part of layer 44, PE 12 impact an overlying part of insulating layer 46 located in the gaps between parts of layer 42. Layer 46 is sufficiently thick that SE are emitted from it but not from layer 44. By virtue of capacitive voltage coupling, the part of layer 46 impacted by PE 12 emits SE having an energy related to voltage VA. See Fujioka et al., "Voltage Measurements on Passivated Electrodes with the Scanning Electron Microscope," *SEM*, 1983, pp. 1157–1162, for more information on capacitive coupling. Spectrometer 20 deflects SE 26 having the requisite minimum energy to detector 30 consisting of a scintillator/photomultiplier which collects them and generates a corresponding SE current.

For measuring high-frequency voltage changes, the E-beam system contains a waveform-measurement apparatus. FIG. 3 shows the particular version used in the present system. The 1982 and 1983 Feuerbaum references cited above give a detailed description of this waveform-measurement apparatus. Briefly, clock circuitry 52 provides a boxcar averager 54 with a signal synchronous with the $V_A$ waveform. This signal triggers a pulse generator 56 which causes a beam blanker 58 to pulse the beam of PE 12 so that the SE are emitted from device 40 only at a specified phase of the $V_A$ waveform. Boxcar averager 54 also processes the output current from detector 30 in synchronism with the $V_A$ waveform and provides the resulting current to comparator 32.

Comparator 32 operates in the previously described manner to generate voltage $V_R$ at a value adequate for causing spectrometer 20 to provide detector 30 with substantially the same number of SE 26 as $V_A$ changes. In the present system, the measurement error is the difference between $V_R$ and $V_A$.

Figure 6A:
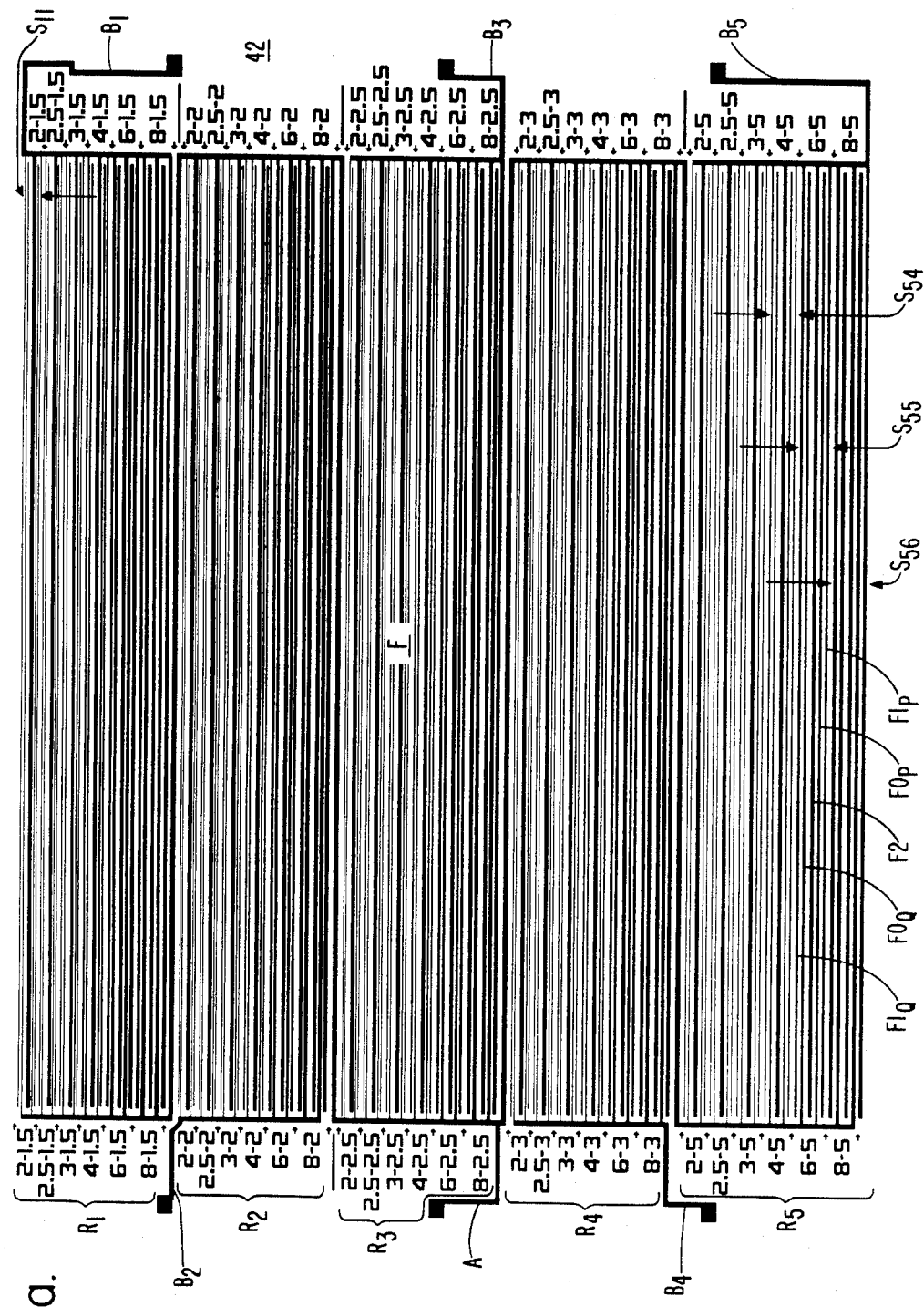
FIGS. 6a and 6b are layout views of the upper and lower conductive layers, respectively, of the test device of FIG. 4.
Figure 6B:
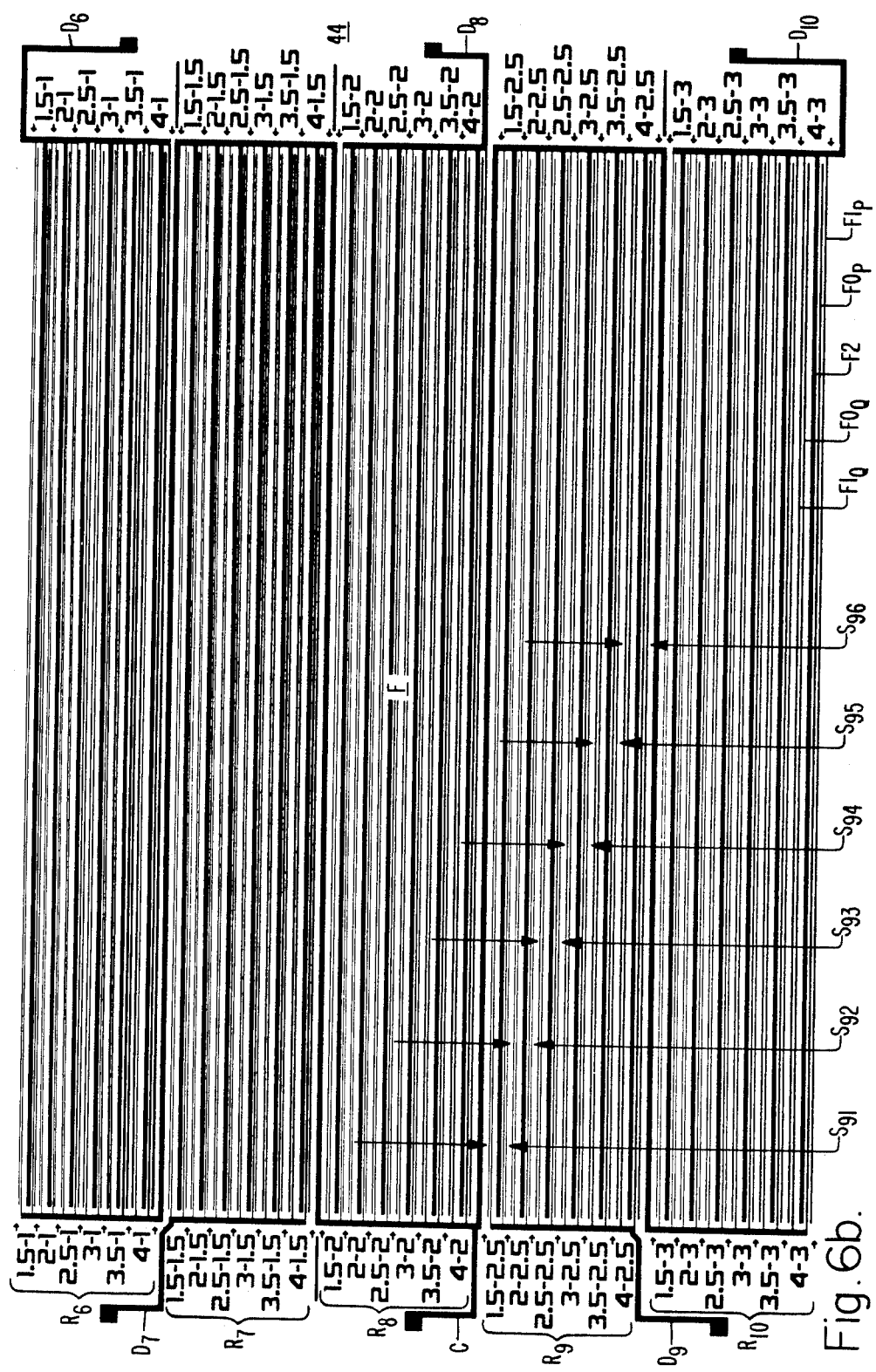

Turning to FIGS. 4, 5a, 5b, 6a, and 6b, they show specific features of device 40. FIGS. 6a and 6b respectively illustrate layouts for layers 42 and 44. FIG. 4 is an expanded top view of a typical portion of device 40. FIGS. 5a and 5b depict cross-sectional views through the device portion shown in FIG. 4.

Upper layer 42 contains five regions $R_1$–$R_5$ as indicated in FIG. 6a. Each region $R_J$ (where J varies from 1 to 5) consists of electrical conductors A and $B_J$ spaced apart from each other. Conductor A is a common electrode for all five regions $R_1$–$R_5$. Each conductor A or $B_J$ connects to an input bond pad. Conductor A has five groups of fingers extending from a main portion, one group for each region $R_J$. Each conductor $B_J$ has a group of fingers extending from a main portion. The fingers, which are generally represented by the symbol "F" in FIG. 6a, run parallel to one another. The group of fingers for each conductor $B_J$ are partially interdigitated with the corresponding group of fingers for conductor A in region $R_J$.

The width of each finger is largely constant along its length. Consequently, the spacing between each pair of adjacent fingers (whether of different conductors or the same conductor) is largely constant along their length. Each finger has a length of approximately 2 millimeters.

Region $R_J$ consists of six subregions $S_{J1}$–$S_{J6}$. Each subregion $S_{JK}$ (where K varies from 1 to 6) contains two main fingers from one of conductors A and $B_J$ and three neighboring fingers from the other.

The dimensional relationships within the set of five fingers in subregion $S_{JK}$ can be understood with the assistance of FIG. 4 which specifically shows subregion $S_{11}$ but equally well represents any other subregion $S_{JK}$. Fingers $F0_P$ and $F0_Q$ extend from a first conductor C1 corresponding to one of conductors A and BJ. Fingers $F1_P$, $F1_Q$, and F2 extend from a second conductor C2 corresponding to the other of conductors A and BJ. For example, conductor C1 is conductor A for any subregion $S_{5K}$ in region $R_5$, whereas conductor C2 is conductor A for any subregion $S_{4K}$ in region $R_4$.

Main finger $F0_P$ lies between neighbors $F1_P$ and F2 in one subset of the set of five fingers. In another subset, main finger $F0_Q$ lies between neighbors $F1_Q$ and F2. Fingers $F0_P$ and $F0_Q$ have the same width $w_0$. Similarly, the distance between fingers $F0_P$ and $F1_P$ in the first subset is the same as the distance between fingers $F0_Q$ and $F1_Q$ in the second subset. This spacing is represented as $d_1$. Fingers $F1_P$ and $F1_Q$ have the same width $w_1$.

Returning to FIG. 6a, the numbers along the left-hand and right-hand edges indicate the respective values in micrometers for $w_0$ and $d_1$ of each subregion $S_{JK}$. Thus, "6-5" next to subregion $S_{55}$ means that its $w_0$ is 6 micrometers while its $d_1$ is 5 micrometers.

Looking now at all of layer 42, $w_0$ for each subregion $S_{JK}$ differs from $w_0$ for each other subregion $S_{JK}$ in the same region $R_J$. For example, $w_0$ in region $R_5$ respectively equals 2, 2.5, 3, 4, 6, and 8 micrometers in subregions $S_{51}$, $S_{52}$, $S_{53}$, $S_{54}$, $S_{55}$, and $S_{56}$. On the other hand, $w_0$ is the same in each set of subregions $S_{JK}$ where K has the same value. For example, subregions $S_{15}$, $S_{25}$, $S_{35}$, $S_{45}$, and $S_{55}$ form a set of corresponding subregions in which $w_0$ is 6 micrometers. Dimension $w_1$ equals $w_0$ and thus follows the $w_0$ pattern. However, the width $w_2$ of neighbor F2 is about 8 micrometers for all subregions $S_{JK}$ in layer 42.

As to $d_1$, it is the same in all subregions $S_{JK}$ of each region $R_J$ but differs from one region $R_J$ to another. In particular, $d_1$ respectively equals 1.5, 2, 2.5, 3, and 5 micrometers in regions $R_1$, $R_2$, $R_3$, $R_4$, and $R_5$. The distance $d_2$ between fingers $F0_P$ and F2 in the first subset equals $d_1$ and therefore follows the $d_1$ pattern. Conversely, the distance $d_2$ between fingers $F0_Q$ and F2 in the second subset is approximately 8 micrometers for all subregions $S_{JK}$. Except for subregion $S_{56}$, finger $F1_Q$ is thus the principal neighbor of finger $F0_Q$ in each subregion $S_{JK}$.

Lower layer 44 is arranged in the same way as layer 42. Layer 44 contains five further regions $R_6$–$R_{10}$ as indicated in FIG. 6b. Each further region $R_J$ (where J here varies from 6 to 10) consists of separate conductors C and $D_J$. Conductor C is a common electrode for all five regions $R_6$–$R_{10}$. Each conductor C or $D_J$ connects to an input bond pad. Layers 42 and 44 are interconnected at the bond pads by way of vias through insulating layer 46.

Conductor C has five groups of fingers extending from a main portion, one group for each of regions $R_6$–$R_{10}$. Each conductor $D_J$ has a group of fingers extending from a main portion. The fingers in layer 44 run substantially parallel to one another and approximately perpendicular to the fingers in layer 42. The fingers for each conductor $D_J$ are partially interdigitated with the corresponding fingers for conductor C in further region $R_J$. As in layer 42, the width of each finger in layer 44 is substantially constant along its length of approximately 2 millimeters.

Further region $R_J$ consists of six subregions $S_{J1}$–$S_{J6}$. Each subregion $S_{JK}$ in layer 44 contains two main fingers from one of conductors C and $D_J$ and three neighboring fingers from the other. The fingers in layer 44 have the same dimensional relationships as the fingers in layer 42. The only difference is that the specific dimensions are different. The numbers along the left-hand and right-hand edges of FIG. 6b indicate the respective values in micrometers for $w_0$ and $d_1$ of each subregion $S_{JK}$ in layer 44. Thus, $w_0$ respectively equals 1.5, 2, 2.5, 3, 3.5, and 4 micrometers in subregions $S_{J1}$–$S_{J6}$ of each further region $R_J$. Dimension $d_1$ is constant in each further region $R_J$ but respectively equals 1, 1.5, 2, 2.5, and 3 micrometers in regions $R_6$–$R_{10}$.

Device 40 is made according to conventional semiconductor processing techniques. Layers 42 and 44 are formed by standard deposition/masking methods. Layer 46 consists of about 1.0 micrometer of silicon dioxide deposited on layer 44. Layer 48 consists of about 0.6 micrometer of silicon dioxide thermally grown along the top of substrate 50.

In utilizing device 40, the voltage on grid 22 in the E-beam probe is adjusted to a value that achieves a suitably high extraction field, typically 300–900 volts/millimeter. To avoid damaging critical areas in current and future IC's, particularly memory devices, examined with the present system, the PE beam energy should not exceed 2.5 keV and, desirably, should not exceed 1.5 keV. The beam energy is preferably 1 keV at a beam current of 0.2 nanoampere. The beam diameter is about 0.1 micrometer where PE 12 impact device 40.

For quantitative voltage measurements, one of regions $R_J$ in conductive layer 42 or 44 is selected. With reference to FIG. 4, voltage $V_A$ is applied at various fixed levels to conductor C1 from which main fingers $F0_P$ and $F0_Q$ extend in the selected region $R_J$. $V_A$ typically ranges from −10 to −10 volts. Conductor C2 is held at a fixed reference voltage likewise ranging from −10 to 10 volts.

Measurements of $V_R$ are made as the PE beam is focused on various ones of fingers $F0_P$ and $F0_Q$ in selected region $R_J$. After repeating this procedure for other regions $R_J$, the measured $V_R$ values are compared with the corresponding $V_A$ values to assess how local electric fields influence the measurements as a function of $w_0$, $d_1$, $w_1$, $w_2$, and the $V_A$ magnitude. The effect of the number of neighbors is determined by $d_2$. Correlation factors can be developed to correct for the deviations of $V_R$ from $V_A$. By varying other parameters such as the extraction field strength, beam diameter, electron optical working distance, and beam position, criteria can be established for improving or optimizing the system components and operating conditions.

While the invention has been described with reference to a particular embodiment, this description is solely for the purpose of illustration and should not be construed as limiting the scope of the invention claimed below. For example, different dimensional relationships could be used for the conductive fingers as long as they run substantially parallel to one another in each conductive layer. The test device could be employed to characterize other types of E-beam probes and to set up standard operating conditions for them. Various modifications, changes, and applications may thus be made by those skilled in the art without departing from the true scope and spirit of the invention as given in the appended claims.

We claim:

1. A system comprising: a test device in which a patterned electrically conductive layer lies on an electrically insulating layer; means for directing a beam of primary electrons towards the conductive layer to cause the device to emit secondary electrons; and means for collecting secondary electrons emitted from the device; characterized in that the conductive layer comprises at least one region, each region comprises first and second conductors separated from each other, each conductor has a group of fingers extending from a main portion, the fingers run substantially parallel to one another and are at least partially interdigitated, the width of each finger is largely constant along its length, each region is composed of a plurality of subregions, each subregion has a specified one of the fingers of the first conductor lying between a first of the fingers of the second conductor and a second of the fingers of one of the conductors, and $w_0$ for each subregion differs from $w_0$ for each other subregion in the same region where $w_0$ is the width of the specified finger in each subregion.

2. A system as in claim 1 characterized in that there are at least two regions, the subregions fall into sets of corresponding subregions, each subregion in each set comes from a different one of the regions, and $w_0$ is largely the same for all the corresponding subregions in each set.

3. A system as in claim 2 characterized in that $d_1$ is largely the same for all the subregions in each region where $d_1$ is the distance between the first finger and the specified finger in each subregion.

4. A system as in claim 3 characterized in that $d_1$ for each region differs from $d_1$ for each other region.

5. A system as in claim 4 characterized in that the second finger in each subregion is one of the fingers of the second conductor in that subregion.

6. A system as in claim 5 characterized in that $d_2$ varies largely linearly with $d_1$ where $d_2$ is the distance between the second finger and the specified finger in each subregion.

7. A system as in claim 6 characterized in that $w_0$, $d_1$ and $d_2$ are all less than 10 micrometers, the energy of the beam being no greater than 2.5 kiloelectron volts.

8. A system as in claim 5 characterized in that $d_2$ is largely the same for all the subregions where $d_2$ is the distance between the second finger and the specified finger in each subregion.

9. A system as in claim 6 characterized in that $w_1$ varies largely linearly with $w_0$ where $w_1$ is the width of the first finger in each subregion.

10. A system as in claim 9 characterized in that $w_2$ is largely the same for all the subregions where $w_2$ is the width of the second finger in each subregion.

11. A method comprising the steps of: directing a beam of primary electrons towards a patterned electrically conductive layer lying on an electrically insulating layer of a test device to cause it to emit secondary electrons; collecting secondary electrons emitted from the device; and generating an electrical signal representative of the energy of the collected secondary electrons; characterized in that the conductive layer comprises at least one region, each region comprises first and second conductors separated from each other, each conductor has a group of fingers extending from a main portion, the fingers run substantially parallel to one another and are at least partially interdigitated, the width of each finger is largely constant along its length, each region comprises a plurality of subregions, each subregion has a specified one of the fingers of the first conductor lying between a first of the fingers of the second conductor and a second of the fingers of one of the conductors, $w_0$ for each subregion differes from $w_0$ for each other subregion in the same region where $w_0$ is the width of the specified finger in each subregion, and $d_1$ is largely the same for all the subregions in each region where $d_1$ is the distance between the first finger and the specified finger in each subregion.

12. A method as in claim 11 characterized in that the energy or the beam is no greater than 1.5 kiloelectron volts.

13. A method as in claim 11 characterized in that there are at least two regions, the subregions fall into sets of corresponding subregions, each subregion in each set comes from a different one of the regions, $w_0$ is largely the same for all the corresponding subregions in each set, and $d_1$ for each region differs from $d_1$ for each other region.

14. A method as in claim 13 characterized in that the energy of the beam is no greater than 2.5 kiloelectron volts.

15. A test device in which a patterned electrically conductive layer comprising a plurality of regions lies on an electrically insulating layer of a substructure, each region comprises first and second conductors spaced apart from each other, each conductor has a group of fingers extending from a main portion, the fingers run substantially parallel to one another and are at least partially interdigitated, the width of each finger is largely constant along its length, each region is divided into a plurality of subregions corresponding on a one-to-one basis to the subregions in each other region, each subregion has a specified one of the fingers of the first conductor lying between a first of the fingers of the second conductor and a second of the fingers of one of the conductors, $w_0$ for each subregion differs from $w_0$ for each other subregion in the same region where $w_0$ is the width of the specified finger in each subregion, $w_0$ is largely the same in each set of corresponding subregions, $d_1$ is largely the same for all the subregions in each region where $d_1$ is the distance from the first finger to the specified finger in each subregion, and $d_1$ for each region differs from $d_1$ for each other region.

16. A device as in claim 15 wherein the second finger in each subregion is one of the fingers of the second conductor in that subregion, and $d_2$ varies largely linearly with $d_1$ where $d_2$ is the distance between the second finger and the specified finger in each subregion.

17. A device as in claim 16 wherein $w_0$, $d_1$, and $d_2$ are all less than 10 micrometers.

18. A device as in claim 17 wherein $w_1$ varies largely linearly with $w_0$ where $w_1$ is the width of the first finger in each subregion.

19. A device as in claim 18 wherein $w_2$ is largely the same for all the subregions where $w_2$ is the width of the second finger in each subregion.

20. A device as in claim 15 wherein the substructure includes a further patterned electrically conductive layer comprising a plurality of further regions lying on a further electrically insulating layer below the first-mentioned insulating layer, each further region comprises third and fourth conductors separated from each other, each of the third and fourth conductors has a group of fingers extending from a main portion, the fingers of the third and fourth conductors run largely perpendicular to the fingers of the first and second conductors and are at least partly interdigitated, and the width of each finger of the third and fourth conductors is largely constant along its length.

* * * * *